(12) United States Patent
Tzanavaras et al.

(10) Patent No.: US 6,230,400 B1
(45) Date of Patent: May 15, 2001

(54) METHOD FOR FORMING INTERCONNECTS

(76) Inventors: George Tzanavaras, 2674 Park Wilshire Dr., San Jose, CA (US) 95124; Mihalis Michael, 2029 Fruitvale Ct., Antioch, CA (US) 94509

( * ) Notice: Subject to any disclaimer, the term of this patent is extended or adjusted under 35 U.S.C. 154(b) by 0 days.

(21) Appl. No.: 09/398,940

(22) Filed: Sep. 17, 1999

(51) Int. Cl.[7] .................................................. H05K 3/34
(52) U.S. Cl. ............................. 29/840; 29/832; 29/879
(58) Field of Search ......................... 29/832, 830, 833, 29/840, 841, 879, 884

(56) References Cited

U.S. PATENT DOCUMENTS

| | | | |
|---|---|---|---|
| 5,068,714 | * 11/1991 | Seipler . | |
| 5,074,947 | 12/1991 | Estes et al. | 156/307.3 |
| 5,386,624 | * 2/1995 | George et al. | 29/832 |
| 5,492,863 | * 2/1996 | Higgins, III . | |
| 5,616,206 | * 4/1997 | Sakatsu et al. . | |
| 5,820,716 | * 10/1998 | Tuttle | 29/832 |
| 5,842,273 | * 12/1998 | Schar . | |
| 5,843,251 | * 12/1998 | Tsukagoshi et al. | 29/832 |
| 6,000,127 | * 12/1999 | Eifuku et al. | 29/832 |
| 6,042,682 | * 3/2000 | Funaya et al. | 29/832 |

OTHER PUBLICATIONS

Hold–Down Technique for Metal Masks Using Permanent Magnets, by G. Tzanavaras, *IBM Technical Disclosure Bulletin*, vol. 20, No. 1, Jun. 1977, p. 364.

"Gold Ball Bumps for Adhesive Flip Chip Assembly" by R. Aschenbrenner, J. Gwiasda, J. Eldring, E. Zakel, and H. Reichel, *VDI/VDE–IT Adhesives in Electronics,* Berlin, Nov. 2–4, 1994.

"Micro SMT™ Chip Scale Packaging for Int. Cir., A Technical White Paper" from ChipScale, Inc. 1995.

"Innovative Adhesives and Mounting Tech., Bonding Instead of Soldering of Tin–plated Components" INFO, Information Magazine from the House of Polytec, May 1995.

"Wafer Bumping Technologies—A Comparative Analysis of Solder Deposition Processes and Assembly Considerations" by D. S Patterson, P. Elenius, and J. A. Leal, *Advances in Electronic Packaging,* EEP—vol. 19–1, 1997, vol. 1, pp. 337–351.

\* cited by examiner

*Primary Examiner*—Carl J. Arbes
(74) *Attorney, Agent, or Firm*—Michael B. Einschlag

(57) ABSTRACT

An embodiment of the present invention is a method for wafer level IC packaging that includes the steps of: (a) forming compliant, conductive bumps on metalized bond pads or conductors; and (b) surrounding the compliant, conductive bumps in a supporting layer.

41 Claims, 4 Drawing Sheets

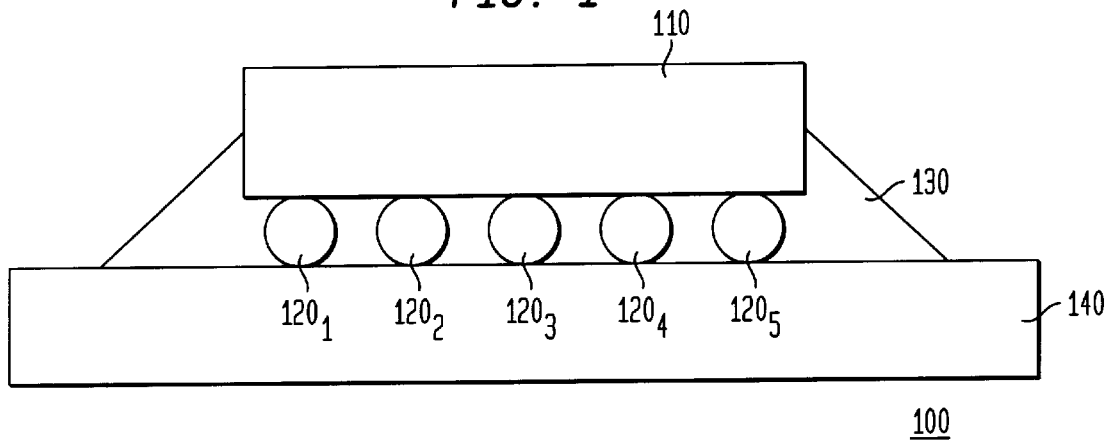
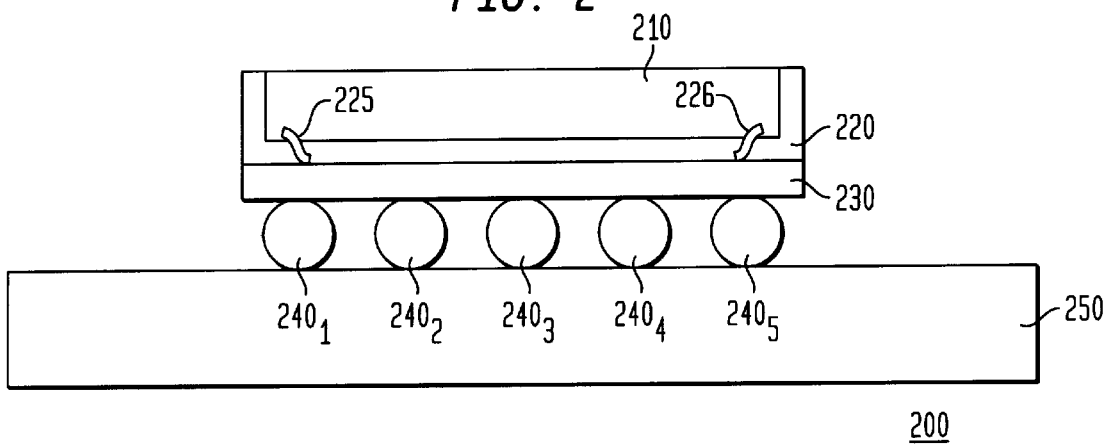

METHOD FOR FORMING INTERCONNECTS

TECHNICAL FIELD OF THE INVENTION

The present invention pertains to the field of forming interconnects and, in particular, to the field of wafer packaging.

BACKGROUND OF THE INVENTION

Prior art conventional Direct Flip Chip ("DFC") packaging technology and Chip Scale Package ("CSP") packaging technology provide integrated circuit ("IC") assemblies that address Original Equipment Manufacturer ("OEM") requirements for smaller, thinner, lighter, denser, and lower cost packages for ICs. However, reliability and cost of these prior art, conventional packaging technologies continue to be important issues. A brief outline of the above-identified prior art conventional packaging technologies and the problems they face follows with reference to FIGS. 1 and 2.

In particular, FIG. 1 shows, in pictorial form, underfilled Flip Chip Assembly 100 that is fabricated in accordance with prior art DFC packaging technology. As shown in FIG. 1, wafer die 110 (having a coefficient of thermal expansion ("CTE") of about 3 ppm/°C.) is bonded to interconnect joints $120_1$–$120_5$ and interconnect joints $120_1$–$120_5$ are bonded, in turn, to (mounted on) printed circuit board ("PCB") 140 (having a CTE of about 14 to 21 ppm/°C.). In addition, underfill material 130 is disposed between wafer die 110 and PCB 140 to surround interconnect joints $120_1$–$120_5$. Thermal mismatch between the various package materials (for example, CTE differences between wafer die 110 and PCB 140) causes high residual stresses, resulting in device failure at connections between vias and interconnect joints $120_1$–$120_5$ and at connections between PCB 140 and interconnect joints $120_1$–$120_5$. In accordance with this prior art packaging technology, stress is reduced, and reliability is thereby enhanced, by surrounding interconnect joints $120_1$–$120_5$ with underfill material 130 (for example, a thermo-set polymer). However this prior art method of stress reduction does not reduce device-to-board interfacial stresses (i.e., stresses between wafer die 110 and PCB 140), instead, it redistributes them into a greater area to reduce stress and strain at interconnect joints $120_1$–$120_5$. Unfortunately, this prior art method of stress reduction has the following drawbacks: (a) inherent processing problems with underfill material 130 relating to dispensing/injection and (b) the fact that, after underfill material 130 is cured, encapsulated interconnect joints $120_1$–$120_5$ cannot be reworked in case of failure. The fact that encapsulated interconnect joints $120_1$–$120_5$ cannot be reworked in case of failure drives a need to have a "Known Good Die" ("KGD") before surface mounting it to PCB 140. This can be very costly for assembly manufacturers.

Lastly, the above-identified problems necessitate that an interposer (flexible or rigid) of some kind be used in addition to the DFC packing technology. Unfortunately, this adds to the size and cost of the package, while decreasing device functional performance.

Flip Chip Technologies, Inc. of Phoenix, Ariz. has adopted an Ultra Chip Scale Package ("CSP") packing technology to enhance the strength of interconnect joints either by increased joint geometry (height) or by utilizing new, and more expensive, solder joint alloys having greater mechanical strength. The purpose is to increase the life expectancy of the device at the solder interconnect joints. However, underfill material is still needed in the package assembly so that solder interconnect joints pass more than 200 thermal cycles (–40° C. to 125° C.) when larger die size is required. See an article by D. S. Patterson, P. Elenius, and J. A. Leal entitled "Wafer Bumping Technologies—A Comparative Analysis of Solder Deposition Processes and Assembly Considerations, *EEP—Vol.* 19-1, Advances in Electronic Packaging—1997 *Volume* 1 *ASME* 1997, pp. 337–351.

FIG. 2 shows, in pictorial form, µBGA® CSP Assembly 200 that is fabricated in accordance with prior art µBGA® CSP packaging technology of Tessera Inc. of San Jose, Calif. ("Tessera"). As shown in FIG. 2, wafer die 210 (having a CTE of about 3 ppm/°C.) is encapsulated in compliant elastomer layer 220. In accordance with this packaging technology, compliant elastomer layer 220 is supposed to provide a decoupling mechanism between wafer die 210 and PCB 250. As further shown in FIG. 2, compliant elastomer layer 220 is bonded to interposer 230, and interposer 230 is bonded, in turn, to interconnect joints $240_1$–$240_5$. As still further shown in FIG. 2, interconnect joints $240_1$–$240_5$ are bonded to PCB 250 (having a CTE of about 14 to 21 ppm/°C.). In addition, first level interconnects 225 and 226 are highly compliant leads that are formed in an "S" shape.

Although this prior art packaging technology allows wafer die 210 to move independently of PCB 250, it significantly reduces device reliability because of the high CTE of compliant elastomer layer 220, i.e., the bonded leads are forced into excessive deflection by compliant elastomer layer 220. As shown in FIG. 2, Tessera's solution to this problem was to construct highly compliant leads ("S" shaped first level interconnects 225 and 226) to take up these large strains. Unfortunately, this prior art packaging technology has tight process windows, which results in low assembly yields, higher costs, and low first level interconnect reliability.

In addition, the prior art CSP packaging technology requires the use of interposer 230 (for example, Flex or TAB tape) which adds to the cost of the package and reduces assembly yields. In further addition, the prior art CSP packaging technology requires customized equipment for high volume manufacturing, which customized equipment can be very costly.

As one can readily appreciate from the above, a need exists in the art for a method for wafer level IC packaging that: (a) can eliminate underfill layers; (b) enables rework to be done at board and chip level assembly; (c) minimizes the effects of thermal mismatches between PCBs and chip assemblies in a cost effective manner; (d) enables testing at the wafer level; and (e) can eliminate the need for an interposer.

SUMMARY OF THE INVENTION

Embodiments of the present invention advantageously satisfy the above-identified need in the art and provide a method for forming interconnects that can be applied to provide wafer level IC packaging. In accordance with the present invention, one can provide wafer level IC packaging that: (a) can eliminate underfill layers, thereby enhancing packaging reliability; (b) enables rework to be done at board and chip level assembly; (c) minimizes the effects of thermal mismatches between printed circuit boards ("PCBs") and chip assemblies in a cost effective manner; (d) enables testing at the wafer level; (e) can eliminate the need for an interposer, thereby reducing material and processing cost; and (f) can be fully integrated into existing semiconductor manufacturing lines. Further embodiments of the present invention: (a) enable high density of packaging at the wafer level by enabling the size of interconnect joints to be minimized without reducing their mechanical integrity; (b) provide a chip size, high density, high power package with an integral, low profile, fin heat sink on the backside of the wafer; (c) eliminate solder paste printing, solder ball mounting, and flux cleaning by forming contact metallurgy using wet or dry processing methods such as, for example and without limitation, physical vapor deposition and high deposition rate electroplating of various metal alloys; and (d) depending on the outer joints, reduce device damage from alpha particles emitted by lead-containing solder interconnects.

An embodiment of the present invention is a method for forming interconnects that comprises: (a) forming compliant, conductive bumps on metalized bond pads or conductors; and (b) surrounding the compliant, conductive bumps in a supporting layer. A further embodiment of the present invention comprises forming conductive bumps over the compliant, conductive bumps.

BRIEF DESCRIPTION OF THE FIGURE

FIG. 1 shows, in pictorial form, an underfilled Flip Chip Assembly fabricated in accordance with prior art Direct Flip Chip ("DFC") packaging technology;

FIG. 2 shows, in pictorial form, a μBGA® CSP Assembly fabricated in accordance with prior art μBGA® CSP packaging technology of Tessera Inc., San Jose, Calif.;

DETAILED DESCRIPTION

An embodiment of the present invention is a method for forming interconnects. In particular, embodiments of the inventive method can be used for wafer level, integrated circuit ("IC") packaging.

Figure 3:
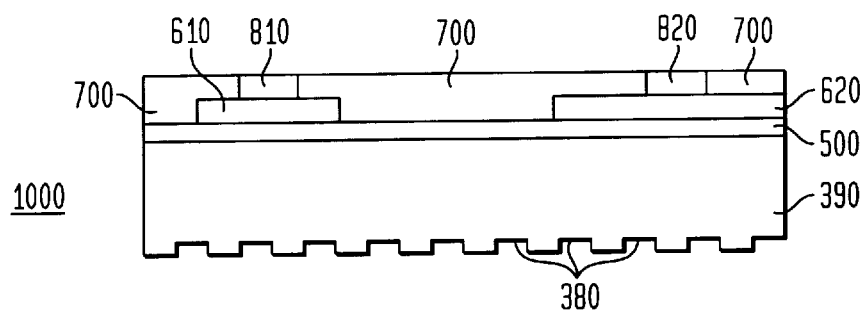
FIG. 3 shows, in pictorial form, an integrated circuit ("IC") (formed on a wafer) having open vias in a dielectric after it has undergone a complete IC manufacturing process.

The following describes a preferred embodiment of the present invention for wafer level IC packaging in conjunction with FIGS. 3–12. FIG. 3 shows, in pictorial form, IC 1000 (formed on a wafer) having open vias in a dielectric after it has undergone a complete IC manufacturing process. As shown in FIG. 3, IC 1000 comprises: (a) a portion of silicon wafer 390; (b) oxide layer 500 which is formed on silicon wafer 390; (c) conductors 610 and 620 which are formed on oxide layer 500; and (d) dielectric layer 700 which is formed over conductors 610 and 620 and oxide layer 500. As further shown in FIG. 3, vias 810 and 820 have been formed through dielectric layer 700 to expose conductors 610 and 620, respectively. In accordance with a first step of the preferred embodiment of the present invention (this is an optional trenching step), trenches 380 are formed on the backside of wafer 390 by any one of many additive or subtractive processes that are well known to those of ordinary skill in the art. Advantageously, this trenching step provides trenches that facilitate device cooling.

Figure 4:
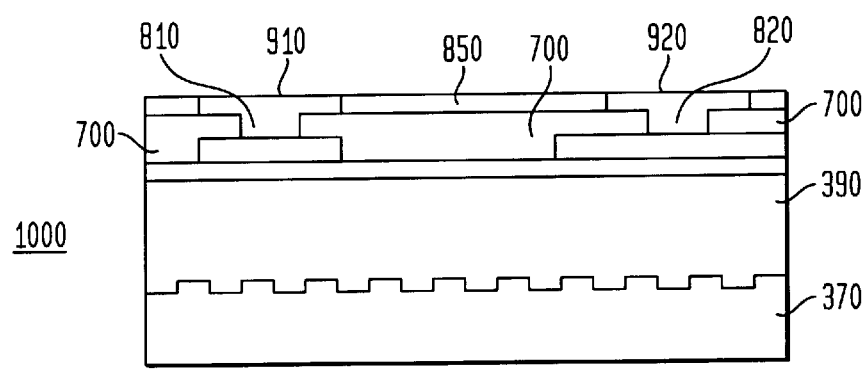
FIG. 4 shows, in pictorial form, the IC of FIG. 3 with a metal mask and magnet used in forming metalized bond pads and/or redistributing conductors.

In accordance with a next step of the preferred embodiment of the present invention, bond pads are formed and conductors are optionally routed. The first part of this next step comprises cleaning vias 810 and 820. For example, if conductors 610 and 620 are formed from aluminum, this step removes native oxide. Vias 810 and 820 may be cleaned using, for example and without limitation: (a) plasma etching processes such as reactive ion etching; (b) sputter etching processes; or (c) chemical etching processes. Embodiments of all of these processes are well known to those of ordinary skill in the art. In addition, as an optional feature of the preferred embodiment of the present invention, conductors 610 and 620 may be redistributed, in situ, using, for example and without limitation, physical vapor deposition ("PVD") through a mask, for example a metal mask. In accordance with the preferred embodiment of the present invention, the metal mask is held against IC 1000 by a magnetic hold-down method that insures conformity. Such a method has been described by G. Tzanavaras in an article entitled "Hold-Down Technique for Metal Masks Using Permanent Magnets" in *IBM Technical Disclosure Bulletin,* Vol. 20, No. 1, June 1977, p. 364. FIG. 4 shows, in pictorial form, IC 1000 with magnet 370 abutted to wafer 390 and metal mask 850 abutted to dielectric layer 700. As further shown in FIG. 4, vias 810 and 820 have been filled and metalized bond pads 910 and 920, respectively, have been formed. Many methods are well known to those of ordinary skill in the art for filling a via and forming a metalized bond pad over a filled via. Next, magnet 370 and metal mask 850 are removed to open metalized bond pads 910 and 920.

Figure 5:
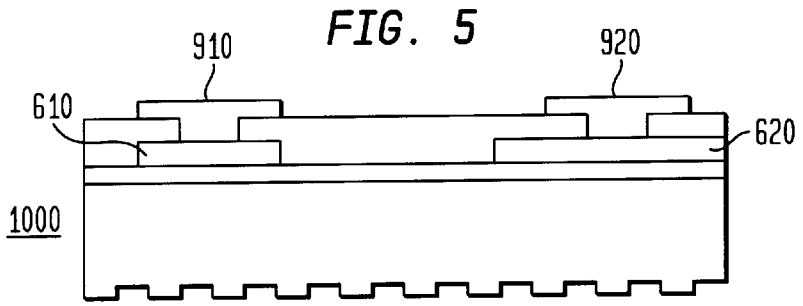
FIG. 5 shows, in pictorial form, the IC of FIG. 4 after the metalized bond pads have been opened.
Figure 6:
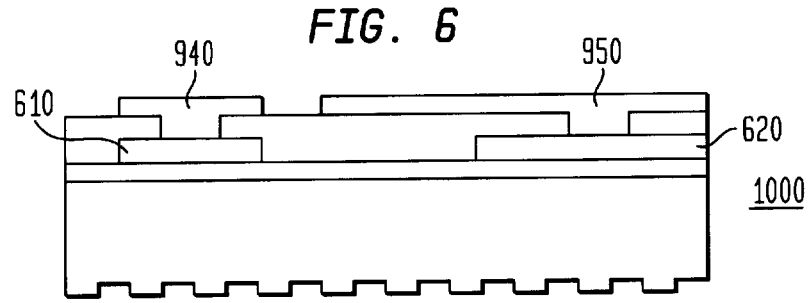
FIG. 6 shows, in pictorial form, the IC of FIG. 5 after the conductors have been redistributed.

FIG. 5 shows, in pictorial form, IC 1000 after metalized bond pads 910 and 920 have been opened. Optionally, conductors 610 and 620 are redistributed in situ by forming conductors using, for example, PVD through metal mask 850. FIG. 6 shows, in pictorial form, IC 1000 after conductors 610 and 620 have been redistributed by conductors 940 and 950. Redistribution materials, and/or via fill materials, and/or bond pad materials include alloys such as: Cr/Cu/Au, Ti/Cu/Au, Cr/Ni/Au, Cr/Pd—Ag, Al/Cu—Ni, but are not limited to these examples. As should be clear to those of ordinary skill in the art, redistribution materials, and/or via fill materials, and/or bond pad materials are selected for their electrical and physical characteristics, such as conductivity, electromigration, resistance to corrosion, solubility, and so forth. Further, many suitable materials and methods for applying them are well known to those of ordinary skill in the art. As is well known to those of ordinary skill in the art, such materials are typically referred to as Under Bump Metalization ("UBM"). UBM acts, among other things, as: (a) a barrier layer to protect the underlying conductors from furrer oxidation; and (b) an interface to subsequently deposited interconnect materials. It such be clear that although UBM is typically utilized for aluminum conductors, it may not be necessary for certain applications involving copper conductors.

In accordance with a next step of the preferred embodiment of the present invention, compliant, conductive bumps are formed. In accordance with this next step, compliant, conductive bumps (with optional capping layers) are formed, for example and without limitation, through: (a) a stencil; or (b) a metal mask using, for example, the magnetic hold-down method described above, all of which methods are well known to those of ordinary skill in the art. The optional capping layers are formed on top of the compliant, conductive bumps: (a) to provide compatibility with outer joint metallurgy; and (b) to provide a transition between the compliant, conductive bumps and the outer joint metallurgy. As should be well known to those of ordinary skill in the art, compatibility refers to, among other things, coefficient of thermal expansion ("CTE") or well known relevant physical characteristics. For example, the outer joint metallurgy may be soluble in the capping layer to enable it to be affixed thereto.

Figure 7:
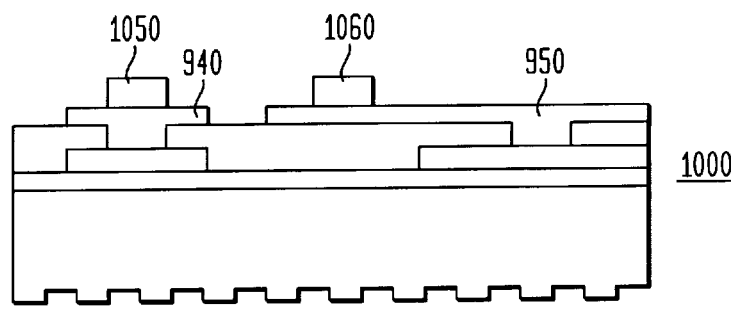
FIG. 7 shows, in pictorial form, the IC of FIG. 6 after compliant, conductive bumps have been formed over the redistributed conductors.

In accordance with the present invention, the compliant, conductive bumps may be formed as compliant, conductive, epoxy bumps (many methods are well known to those of ordinary skill in the art for forming compliant, conductive, epoxy bumps) or as conductive organic material such as, for example, thermo-set epoxies of isotropic or anisotropic format as well as thermoplastic or elastomeric adhesives with conductive fillers. In a preferred embodiment, the magnetic hold down technique using metallic or organic masks can be used to print and semi-cure the bumps. Further, it is within the scope of the present invention that capping layers are optionally formed over the compliant, conductive bumps in this step. FIG. 7 shows, in pictorial form, IC 1000 after this step, wherein compliant, conductive bumps 1050 and 1060 are formed over redistributed conductors 940 and 950, respectively.

Figure 8:
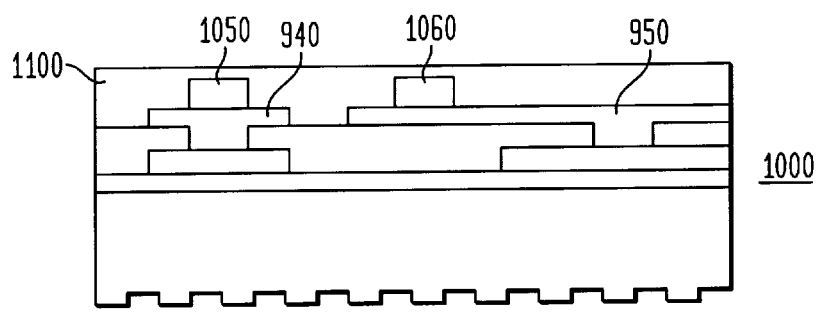
FIG. 8 shows, in pictorial form, the IC of FIG. 7 after a supporting layer has been formed over the compliant, conductive bumps.

In accordance with a next step of the preferred embodiment of the present invention, a supporting layer, for example, a conformal, polymer layer is applied to the IC. The supporting layer could be a negative or a positive photoresist which is pre-baked after being applied. Other materials with similar characteristics can also be used such as, for example, photosensitive polyimides, spin-on-glass (SOG), oxides, nitrides, and other polymers. FIG. 8 shows, in pictorial form, IC 1000 after this step, wherein supporting layer 1100 (for example, a polymer or a polymer resist) is formed over compliant, conductive bumps 1050 and 1060, which compliant, conductive bumps 1050 and 1060 are formed, in turn, over redistributed conductors 940 and 950, respectively. In accordance with the present invention, the supporting layer supports and delineates the compliant, conductive bumps. In addition, for certain embodiments, the supporting layer helps to hold the compliant, conductive bumps in place, i.e., affixed to the conductors and/or bond pads. In accordance with preferred embodiments of the present invention, the supporting layer has physical characteristics that are compatible with that of a PCB to which the IC is connected, for example, physical characteristics such as CTE.

Figure 9:
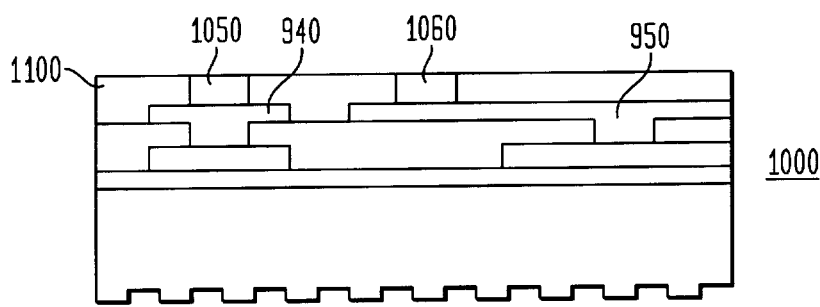
FIG. 9 shows, in pictorial form, the IC of FIG. 8 after the supporting layer has been processed to delineate the compliant, conductive bumps.

In accordance with a next step of the preferred embodiment of the present invention, the bumps are delineated. To do this, when the surrounding layer is a photoresist, the photoresist is exposed to radiation, for example and without limitation, ultraviolet radiation, and developed in accordance with any one of the many methods that are well known to those of ordinary skill in the art. As should be clear to those of ordinary skill in the art, this defines the bumps, and controls their geometry. Next, the polymer (photoresist) is hard baked in accordance with any one of the many methods that are well known to those of ordinary skill in the art. This makes the polymer a permanent part of the bump structure, and advantageously provides the bump structure with a suitable amount of rigidity. The bumps are exposed using any one of a number of methods that are well known to those of ordinary skill in the art such as, for example, and without limitation, plasma cleaning (for example, with an oxygen plasma) or chemical mechanical polishing ("CMP"). The use of CMP is advantageous in making the thicknesses of layers uniform across the wafer. FIG. 9 shows, in pictorial form, IC 1000 after this step, wherein surrounding layer 1100 (for example, a polymer or a polymer resist) is formed in a bump structure with delineated, compliant, conductive bumps 1050 and 1060, which delineated, compliant, conductive bumps 1050 and 1060 are formed, in turn, over redistributed conductors 940 and 950, respectively. Capping layers discussed above can be formed using, for example, previously discussed masking techniques over the delineated compliant, conductive bumps shown in FIG. 9. The shape, size, and material properties of the compliant, conductive bumps and the surrounding layer are chosen in accordance with methods that are well known to those of ordinary skill in the art (for example, using numerical methods such as finite element analysis to simulate the behavior of the different structures) to eliminate high thermal stress concentrations caused by coefficient of thermal expansion mismatches between thermally dissimilar materials or to reduce their strength singularity characteristics to safe levels. By using numerical methods, one can identify weak regions and areas of high thermal stress concentrations. Then different alternative combinations of materials and geometries are studied, optimized and tested. In alternative embodiments, the supporting layer may partially surround the compliant, conductive bumps.

In accordance with a next step of the preferred embodiment of the present invention, outer joints are formed over the exposed, delineated, conductive bumps shown in FIG. 9. In one embodiment of this step, solder outer joints are formed by applying solder flux to IC 1000 and mounting solder balls on top of the exposed, delineated, conductive bumps in accordance with any one of the many methods that are well known to those of ordinary skill in the art. The most common method used today to form second level contacts (the outer joints) is one that uses eutectic solder or high lead solder in sphere type of preforms. However, enabling processes such as ball mounting, reflow, and flux cleaning require the use of very accurate and expensive equipment.

Alternatively, this step of forming solder bumps can also be accomplished by using additive methods such as, for example, by electroplating using solder alloys such as Pb—Sn, Pb—Sn—In, Pd—Ag and other suitable alloys with similar characteristics, which additive methods are well known to those of ordinary skill in the art. In addition, instead of using solder to form the outer joints, the outer joints can be also be formed using non metallic interconnects (for example, conductive, organic materials) such as filled adhesives with electrically conductive fillers such as silver or gold. To do this, one can use organic materials such as, for example, thermo-set epoxies of isotropic or anisotropic format as well as thermoplastic or elastomeric adhesives with conductive fillers or acrylic based adhesives or any other similar polymeric or monomeric material. Further, there are many methods that are well known to those of ordinary skill in the art for forming the outer joints using organic materials such as, without limitation, jetting, printing, dispensing, and so forth. They can be screen or stencil printed onto one of the mating surfaces before the two parts (device package and PCB) are aligned and joined together. A subsequent curing process is required to make the joints permanent. Another approach is to print and cure the conductive adhesives onto one of the surfaces (device package or PCB), and use a second bump (wet), at a later assembly stage, right before the permanent joint is formed. Advantageously, this approach enables separate transportation of the two parts (device package and PCB) until the final joint process step.

Figure 10:
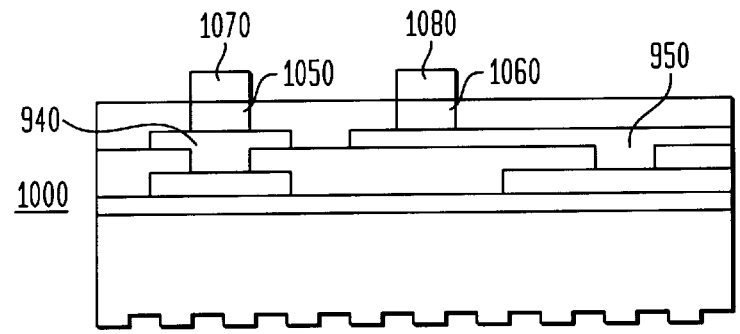
FIG. 10 shows, in pictorial form, the IC of FIG. 9 after outer joints have been formed over the compliant, conductive bumps.

FIG. 10 shows, in pictorial form, IC 1000 after this step, wherein outer joints 1070 and 1080 are formed over compliant, conductive bumps 1050 and 1060, which compliant, conductive bumps 1050 and 1060 are formed, in turn, over redistributed conductors 940 and 950, respectively.

Figure 11:
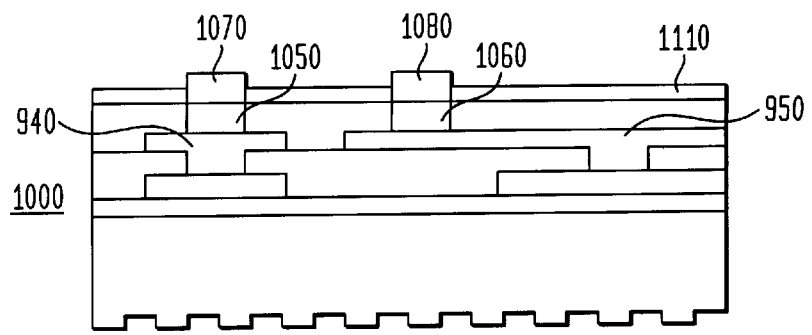
FIG. 11 shows, in pictorial form, the IC of FIG. 10 after outer joints have been formed over the compliant, conductive bumps so as to be partially embedded in a supporting layer.

In an alternative embodiment of the present invention, a form of mechanical interlocking of an outer joint with a conductive bump and the surrounding layer is achieved by controlling the geometry and definition of the outer joints formed during the previous step (in accordance with any one of the many methods that are well known to those of ordinary skill in the art) to cause the outer joints to be disposed, at least partially within a surrounding layer. This is shown in FIG. 11, which FIG. 11 shows, in pictorial form, IC 1000 after this step, wherein outer joints 1070 and 1080 are formed over compliant, conductive bumps 1050 and 1060 so as to be partially embedded in surrounding layer 1110, which compliant, conductive bumps 1050 and 1060 are formed, in turn, over redistributed conductors 940 and 950, respectively. Surrounding layer 1110 may be formed in the same way that surrounding layer 1100 was formed (as described above).

Figure 12:
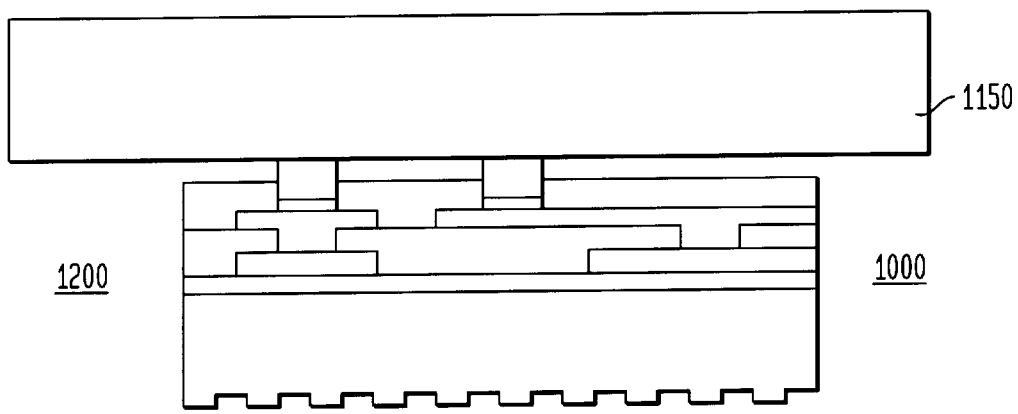
FIG. 12 shows, in pictorial form, a final surface mount assembly after the IC of FIG. 11 has been singulated from the wafer and the IC has been bonded to a printed circuit board ("PCB")

Lastly, FIG. 12 shows, in pictorial form, final surface mount assembly 1200 wherein IC 1000 has been singulated from wafer 390, and has been bonded to printed circuit board ("PCB") 1150 at an end user level in accordance with any one of the many methods that are well known to those of ordinary skill in the art. Advantageously, in accordance with the preferred embodiment of the present invention, no underfill encapsulation is required.

Figure 13:
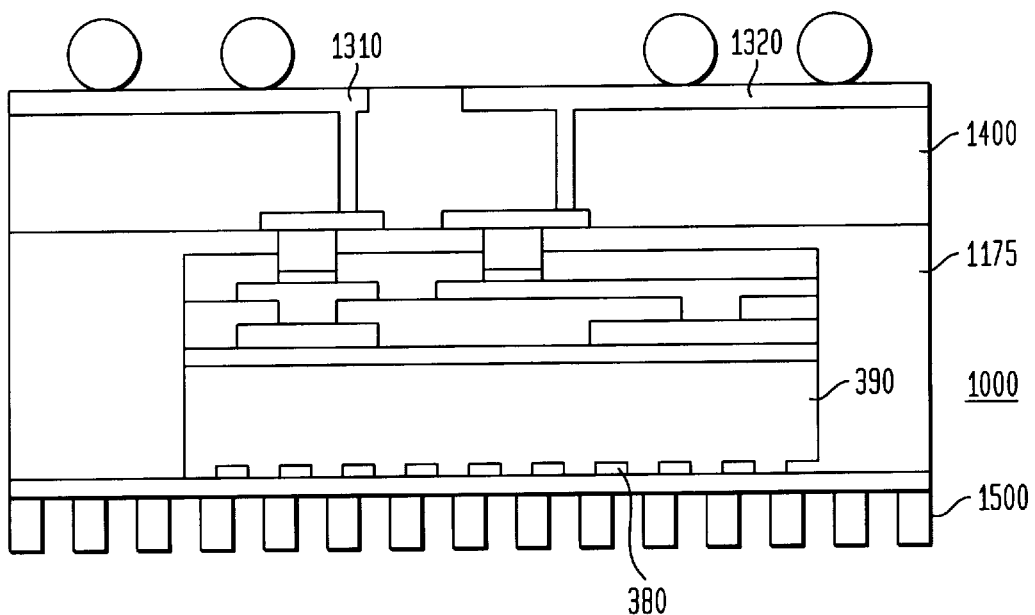
FIG. 13 shows, in pictorial form, a high pin count, a high power device that is fabricated in accordance with the present invention.

It should be understood that although no underfill encapsulation of wafer level IC packages is required, it is with the scope of the present invention to utilize the wafer level package described above in embodiments where encapsulation is utilized. In particular, FIG. 13 shows, in pictorial form, a high pin count, high power device which is fabricated in accordance with further embodiments of the present invention. As shown in FIG. 13, IC 1000 package is formed on a wafer in accordance with the steps described above. Then, IC 1000 is overmolded in encapsulation material 1175 after it has been mounted on a substrate, for example, PBGA, in accordance with any one of many methods that are well known to those of ordinary skill in the art. Optionally, during this step, the package which comprises IC 1000 may be affixed to external heat sink 1500 for improved thermal performance in high pin count, high power applications. As shown in FIG. 13, external heat sink 1500 is affixed to trenches 380 formed on the backside of wafer 390. Next, the PBGA package which comprises IC 1000 is bonded to board 1400 in accordance with any one of many methods that are well known to those of ordinary skill in the art, where board 1400 is, for example, a fan-out PCB or an interposer such as, for example, a two-layer, fan-out substrate. As those of ordinary skill in the art can readily appreciate, fan-out conductors 1310 and 1320 are connected to, for example, a mother board or any other PCB in accordance with any one of many methods that are well known to those of ordinary skill in the art after the packages have been singulated.

Those skilled in the art will recognize that the foregoing description has been presented for the sake of illustration and description only. As such, it is not intended to be exhaustive or to limit the invention to the precise form disclosed.

For example, although the present invention has been described in terms of a method for forming first interconnects comprising compliant conductive bumps surrounded by a supporting layer on a wafer comprised of integrated circuits and for forming outer joints on the first interconnects for connecting to a printed circuit board, embodiments of the present invention are not limited thereto. In general, embodiments of the present invention comprise methods for interconnecting conductors. Specifically, the method described above can be applied to the printed circuit board wherein an interconnect structure comprising a conductive, compliant bump surrounded by a supporting layer is formed on a printed circuit board as well. In further embodiments, an interconnect structure comprising a conductive, compliant bump surrounded by a supporting layer is formed on a wafer comprised of integrated circuits and on a printed circuit board. In such a case, the structures may be bonded together directly or an outer joint may be formed on either or both of the wafer and the printed circuit board. Then, the integrated circuits are singulated and bonded to the printed circuit board.

What is claimed is:

1. A method for forming interconnects comprises:

forming an interconnect structure which includes steps of:

forming compliant, conductive bumps on metalized bond pads or conductors; and then, at least partially surrounding the compliant, conductive bumps in a supporting layer.

2. The method of claim 1 which further comprises a step of forming conductive bumps over the compliant, conductive bumps.

3. The method of claim 2 which further comprises a step of at least partially surrounding the conductive bumps in a second supporting layer.

4. The method of claim 1 wherein the step of forming compliant, conductive bumps comprises forming polymer compliant, conductive bumps.

5. The method of claim 1 wherein the interconnect structure is formed on an integrated circuit on a wafer and wherein the method further comprises forming trenches in the wafer on a side opposite the interconnect structure.

6. The method of claim 1 wherein the bond pads or conductors are formed by a step of depositing through a mask.

7. The method of claim 1 wherein the compliant, conductive bumps are comprised of epoxy.

8. The method of claim 1 wherein the compliant, conductive bumps are comprised of conductive organic material.

9. The method of claim 1 wherein the surrounding layer is comprised of a polymer.

10. The method of claim 1 wherein the surrounding layer is comprised of a photoresist.

11. The method of claim 1 wherein the step of surrounding comprises:
   forming a supporting layer over the compliant, conductive bumps; and
   delineating the compliant, conductive bumps.

12. The method of claim 11 wherein the step of delineating comprises chemical mechanical polishing.

13. The method of claim 11 wherein the supporting layer is comprised of photoresist and wherein the step of delineating comprises:
   exposing the photoresist to radiation;
   developing the photoresist;
   baking the photoresist; and
   exposing the compliant, conductive bumps.

14. The method of claim 2 wherein the step of forming conductive bumps comprises:
   forming solder joints over the compliant, conductive bumps.

15. The method of claim 2 wherein the step of forming conductive bumps comprises:
   electroplating solder joints over the compliant, conductive bumps.

16. The method of claim 2 wherein the step of forming conductive bumps comprises:
   forming conductive bumps from conductive organic materials.

17. The method of claim 3 wherein the second supporting layer is comprised of a polymer.

18. A method for forming interconnects comprises:
   cleaning vias formed on a wafer;
   filling vias and forming metalized bond pads;
   forming compliant, conductive bumps on the metalized bond pads;
   at least partially surrounding the compliant, conductive bumps in a supporting layer;
   delineating the compliant, conductive bumps;
   forming conductive bumps over the compliant, conductive bumps;
   singulating integrated circuits from the wafer; and
   bonding the singulated integrated circuits to a printed circuit board.

19. The method of claim 18 wherein delineating comprises chemical mechanical polishing.

20. A method for forming interconnects comprises:
   cleaning vias formed on a wafer;
   filling vias and forming metalized bond pads;
   forming compliant, conductive bumps on the metalized bond pads;
   at least partially surrounding the compliant, conductive bumps in a supporting layer;
   delineating the compliant, conductive bumps;
   forming conductive bumps over the compliant, conductive bumps;
   singulating integrated circuits from the wafer;
   forming compliant, conductive bumps on a printed circuit board;
   at least partially surrounding the compliant, conductive bumps in a supporting layer;
   bonding the singulated integrated circuits to the printed circuit board.

21. A method of forming interconnects comprises:
   forming an interconnect structure that includes steps of:
   forming compliant, conductive bumps on metalized bond pads or conductors;
   enclosing the compliant, conductive bumps in a supporting layer;
   delineating the compliant, conductive bumps; and
   forming conductive bumps over the compliant, conductive bumps.

22. The method of claim 21 wherein step of forming compliant, conductive bumps comprises forming the compliant, conductive bumps through a metal mask using a magnetic hold-down process.

23. The method of claim 21 wherein the step of forming compliant, conductive bumps comprises forming capping layers on top of the compliant, conductive bumps.

24. The method of claim 21 wherein the step of forming compliant, conductive bumps comprises forming compliant, conductive bumps from epoxy.

25. The method of claim 21 wherein the step of forming compliant, conductive bumps comprises forming compliant, conductive bumps from conductive organic material.

26. The method of claim 21 wherein the step of forming compliant, conductive bumps comprises forming compliant, conductive bumps from thermoset epoxies of isotropic or anisotropic format.

27. The method of claim 21 wherein the step of forming compliant, conductive bumps comprises forming compliant, and forming conductive bumps from thermoplastic or elastomeric adhesives with conductive fillers.7

28. The method of claim 21 wherein the supporting layer is chosen from a group consisting of a conformal polymer layer, a negative photoresist, a positive photoresist, a polymer resist, a photosensitive polyimide, a spin-on-glass, an oxide, and a nitride.

29. The method of claim 21 wherein the supporting layer is a photoresist and the step of delineating the compliant, conductive bumps comprises:
   exposing the photoresist to radiation;
   hard baking the exposed photoresist; and
   cleaning.

30. The method of claim 29 wherein the step of cleaning comprises plasma etching.

31. The method of claim 29 wherein the step of cleaning comprises chemical mechanical polishing.

32. The method of claim 21 which further comprises forming capping layers over the delineated, compliant, conductive bumps using a metal mask and a hold-down process.

33. The method of claim 21 wherein the step of forming conductive bumps comprises:
   applying solder flux to the interconnect structure; and
   mounting solder balls on top of the delineated, compliant, conductive bumps.

34. The method of claim 21 wherein the step of forming conductive bumps comprises:
   electroplating.

35. The method of claim 34 wherein the step of electroplating includes solder alloys.

36. The method of claim 18 wherein the step of cleaning vias comprises cleaning using a process selected from a group consisting of: a reactive ion etching process, a sputter etching process, and a chemical etching process.

37. The method of claim 18 wherein the step of forming metalized bond pads comprises routing conductors.

38. The method of claim 37 wherein the step of routing comprises physical vapor depositing through a metal mask which is held in place by a magnetic hold-down process.

39. The method of claim 21 wherein the interconnect structure is formed on one or more of an integrated circuit and a printed circuit board.

40. A method of forming interconnects comprises:

forming an interconnect structure on one or more of an integrated circuit and a printed circuit board, wherein forming the interconnect structure includes steps of:

forming compliant, conductive bumps on metalized bond pads or conductors;

enclosing the compliant, conductive bumps in a supporting layer;

delineating the compliant, conductive bumps; and forming conductive bumps over the compliant, conductive bumps of one or more of the interconnect structures.

41. The method of claim 2 wherein the step of forming conductive bumps comprises depositing through a metal mask which is held in place by a magnetic hold-down process.

* * * * *